US009989846B2

(12) United States Patent
deVilliers et al.

(10) Patent No.: US 9,989,846 B2
(45) Date of Patent: Jun. 5, 2018

(54) METHOD FOR PATTERNING INCORPORATING MISALIGNMENT ERROR PROTECTION

(71) Applicant: Tokyo Electron Limited, Minato-ku, Tokyo (JP)

(72) Inventors: Anton J. deVilliers, Clifton Park, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/048,719

(22) Filed: Feb. 19, 2016

(65) Prior Publication Data

US 2016/0246172 A1 Aug. 25, 2016

Related U.S. Application Data

(60) Provisional application No. 62/119,146, filed on Feb. 21, 2015.

(51) Int. Cl.
*G03F 7/26* (2006.01)
*G03F 7/00* (2006.01)
*G03F 7/32* (2006.01)
*G03F 7/20* (2006.01)

(52) U.S. Cl.
CPC ............ *G03F 7/0035* (2013.01); *G03F 7/325* (2013.01); *G03F 7/70466* (2013.01); *G03F 7/70633* (2013.01)

(58) Field of Classification Search
CPC ............. G03F 7/0035; G03F 7/26; G03F 7/38
See application file for complete search history.

(56) References Cited

U.S. PATENT DOCUMENTS

| 2002/0135869 | A1 | 9/2002 | Banish et al. |
| 2004/0069745 | A1 | 4/2004 | Ho et al. |
| 2005/0244724 | A1 | 11/2005 | Asano et al. |
| 2011/0281220 | A1* | 11/2011 | Matsuda ............ H01L 21/0273 430/325 |

(Continued)

FOREIGN PATENT DOCUMENTS

| JP | 2005-091096 | 4/2005 |
| JP | 2007-292829 | 11/2007 |

OTHER PUBLICATIONS

International Patent Application No. PCT/US2016/018764, "International Search Report and Written Opinion," International Filing Date Feb. 19, 2016, International Search Report dated May 30, 2016.

*Primary Examiner* — Kathleen Duda
(74) *Attorney, Agent, or Firm* — Oblon, McClelland, Maier & Neustadt, L.L.P.

(57) ABSTRACT

Substrate patterning techniques herein protect against overlay misalignment. Techniques include using a combination of relief patterns in which one relief pattern includes openings filled with a particular photoresist and these openings have a width that is insufficient to enable wave propagation of electromagnetic radiation having wavelengths greater than a predetermined threshold wavelength. Accordingly, actinic radiation above a certain wavelength cannot affect the photoresist within these relatively small openings. Photoresist filled within these openings can be removed by specific developers with the openings partially uncovered, which helps ensure features and connections are fabricated as designed.

16 Claims, 3 Drawing Sheets

(56) References Cited

U.S. PATENT DOCUMENTS

2011/0294072 A1* 12/2011 Park .................. G03F 7/0035
430/312
2014/0263172 A1* 9/2014 Xie ................... G03F 7/405
216/41

* cited by examiner

METHOD FOR PATTERNING INCORPORATING MISALIGNMENT ERROR PROTECTION

CROSS REFERENCE TO RELATED APPLICATIONS

The present application claims the benefit of U.S. Provisional Patent Application No. 62/119,146, filed on Feb. 21, 2015, entitled "Method for Patterning Incorporating Misalignment Error Protection," which is incorporated herein by reference in its entirety.

BACKGROUND OF THE INVENTION

This disclosure relates to patterning thin films and various layers on a substrate. Such patterning includes patterning for fabricating semiconductor devices within a photolithographic patterning scheme.

In material processing methodologies (such as photolithography), creating patterned layers comprises the application of a thin layer of radiation-sensitive material, such as photoresist, to a working surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system such as a scanner or stepper tool. This exposure can then be followed by the removal of irradiated regions of the radiation-sensitive material or non-irradiated regions using a developing solvent depending on a photoresist tone and developer tone. This mask layer may comprise multiple sub-layers.

SUMMARY

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic resolution. One approach to reduce the feature size is to use a conventional lithographic pattern and etch techniques twice on a same substrate (known as LELE—Litho/Etch/Litho/Etch) with one pattern offset from another, thereby forming more features spaced closely together to achieve a smaller feature size than would be possible by a single-exposure lithographic step. During LELE double patterning, the substrate is exposed to a first pattern and the first pattern is developed in the radiation-sensitive material. This first pattern is formed in the radiation-sensitive material and is transferred to an underlying layer using an etching process. This series of steps is repeated to create a second pattern, which is usually offset from the first pattern.

Another approach to reduce feature size is to use a conventional lithographic pattern on the same substrate twice followed by etch techniques (known as LLE—Litho/Litho/Etch), thereby using relatively larger scale patterns spaced closely together to achieve a smaller feature size than would be possible by a single exposure. During LLE double patterning, the substrate is exposed to a first light pattern and then the substrate is exposed to a second light pattern. A first latent pattern and a second latent pattern are developed in the radiation-sensitive material. A resulting topographic or relief pattern formed in the radiation-sensitive material can then be transferred to an underlying layer using an etching process, such as a plasma-based dry etching process.

Another approach to LLE double patterning includes a Litho/Freeze/Litho/Etch (LFLE) technique that uses an application of a freeze material on a first patterned layer to cause cross-linking therein, thus allowing the first patterned layer to withstand subsequent processing of patterning a second layer with a second pattern. A second LFLE freeze technique involves including a cross-linker additive material within the first layer (prior to exposure) instead of depositing a freeze material after development. This cross-linker is then thermally activated to increase resistivity to solvents. Thus this "freeze" refers to changing material properties of a patterned layer to be able to withstand other solvents or resists coated thereon. Conventional LFLE techniques, however, suffer from poor throughput and unacceptable defectivity, among other things.

Such double patterning techniques can be beneficial to create patterns with increasingly smaller critical dimensions (CDs), but as dimension sizes shrink, there is an increased challenge of overlay misalignment.

Systems and methods disclosed herein include techniques for protecting against overlay misalignment. Such techniques include an optical technique to ensure that particular structures combine by having material cleared out for desired formation. This can include techniques for pitch scaling and patterning for trenches, holes, gate structures, contact openings, etc. Techniques include using classically forbidden regions to create "shadowed" regions in photoresist that will not become insoluble despite overlay misalignment.

One embodiment includes receiving a substrate having a first relief pattern. The first relief pattern defines openings having a width less than sufficient to enable wave propagation of electromagnetic radiation that has wavelengths greater than a predetermined threshold wavelength. Depositing a first photoresist on the substrate such that the first photoresist fills openings defined by the first relief pattern and covers the first relief pattern resulting in a first photoresist layer that fills openings defined by the first relief pattern and covers the first relief pattern. The first photoresist layer includes a solubility-shifting component that causes regions of the first photoresist layer exposed to actinic radiation to become insoluble to a negative tone developer. Regions unexposed to actinic radiation remain soluble to the negative tone developer. The first photoresist layer is developed using negative tone developer after the first photoresist layer has been exposed to a pattern of actinic radiation having wavelengths greater than the predetermined threshold wavelength. Such developing includes dissolving and removing first photoresist.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
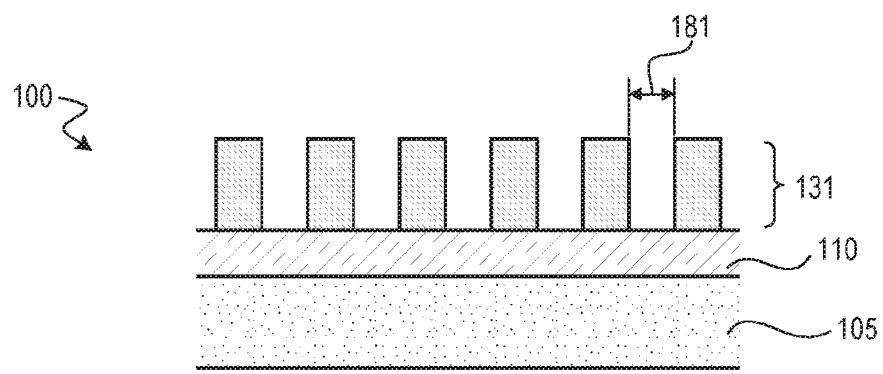
FIG. 1 is a cross-sectional schematic view of an example substrate segment showing a process flow according to embodiments disclosed herein.

Systems and methods disclosed herein include techniques for protecting against overlay misalignment. Such techniques include an optical technique to ensure that particular structures combine or have material cleared out for desired formation. This can include techniques for pitch scaling and patterning for trenches, holes, gate structures, contact openings, etc. Techniques include forming and using classically forbidden regions to create "shadowed" regions in photoresist that will not become insoluble despite overlay misalignment.

As such, certain photoresist can be cleared out of trenches or openings in a relief pattern even if the underlying filled trench or filled hole is only partially uncovered. Techniques herein can be described as providing a "snapping" action, which can be either a positive or negative shift to or away from a feature despite overlay misalignment. This can be either a positive shift toward an edge to "snap to" a material by local addition of material, or a negative shift away from an edge to "snap away" where material is locally subtracted. Such techniques can address situations in which there is a non-linearity between overlay input and overlay output.

Certain positive tone photoresists are soluble to certain negative tone developers until actinic radiation causes these photoresists to become insoluble. By depositing such photoresist within openings that define a classically forbidden space to actinic radiation being used, the result is that the photoresist within these opening does not receive sufficient actinic radiation to shift its solubility. Accordingly, as long as a given opening is at least partially uncovered, then the photoresist within the opening can be removed by negative tone developers.

Thus, defined openings are formed in a given relief pattern (which can be a combined relief pattern) that are small enough that electromagnetic radiation above a predetermined wavelength (having wavelengths longer than a particular wavelength) has a wavelength too great to be able to propagate within the defined openings. Since such radiation attenuates exponentially within the defined opening, there is insufficient actinic radiation to shift a solubility of photoresist within the openings. Thus, these defined openings define a region of non-propagation. Such regions can be narrow trenches, holes, interstitial spaces, etc. Instead of propagating, the wavelength or light within the defined openings becomes an evanescent wave that exhibits exponential decay without absorption. The result is that the photoresist within these holes or trenches remains soluble to a negative tone developer compatible (NTD) resist even if a lithographic pattern of light extends over or across these defined openings. This enables pattern compositions with forced shifting or creation of features despite overlay misalignment.

In other words, a pattern can snap to a trench completely even if partially misaligned. A particular trench will essentially be guaranteed to open. In other words, a forced formation of a trench prevents an otherwise typical result of misalignment. Because holes or trenches are filled with negative tone developer compatible resist (positive tone photoresist), and because the hole or trench has a width/diameter less than a size that enables light propagation of the actinic radiation being used (of a particular wavelength), there is essentially insufficient actinic radiation propagated within a trench/or hole to shift a solubility of the photoresist. Thus, even if a light is directed across a given trench of this size, it will not cause the resist within the trench/hole to become insoluble because the width of the trench/hole is less than a size that allows that particular wavelength(s) of light to propagate. Such an evanescent wave attenuates in a classically forbidden region. In other words, the trench or hole is small enough that it is essentially "shadowed" from the actinic radiation. As such, this shadowed area optically produces a snapping region or region of a positive shift. Technically, the photoresist within these openings is not shadowed (light being obstructed by an object), but the combination of feature size and light wavelength creates a condition in which the quantum of light is on a scale that is too large to propagate into the opening—the light will attempt to quantum mechanically tunnel, but will exponentially attenuate. The result is that light or light used for a patterning processes cannot reach a bottom of the trench. Because the resist used is negative tone developer compatible resist (positive tone resist), the unexposed portion of the resist will wash away in the develop step without scumming and without significant misalignment.

Techniques herein can function on any relief pattern including a relief pattern comprised of one or more photoresist layers that have been "frozen" (i.e., treated) to prevent subsequent solubility shifts. The litho freeze herein can be applied to any lithographically produced pattern such as dual tone, antispacer, positive tone, negative tone, resists having been slimmed or modified by acid diffusion, etc.

Current photolithography trends include using negative tone developer compatible photoresists. Such photoresists are positive tone photoresists but are developed using a negative tone development technique. A conventional positive tone photoresist responds to actinic radiation by deprotecting to a developing solvent. In other words, portions of a positive tone photoresist exposed to radiation have a solubility shift in which solubility is increased to a positive tone developer. With negative tone development, however, a positive photoresist is used, but it is the unexposed (protected) region that is dissolved by negative tone developer solvents.

This includes a positive tone photoresist that can be developed using negative tone developers in that unexposed portions of the positive tone photoresist are dissolvable by one or more negative tone developer solvents.

Positive tone developer chemistries are known. Developing a pattern using positive tone development (PTD) involves removing an exposed region of a latent pattern in a photoresist film by the action of an aqueous base developer such as aqueous tetramethylammonium hydroxide (TMAH). An exemplary positive tone developer is 0.26N TMAH (aq.). Alternatively, the same latent pattern in the photoresist film can be developed using an organic solvent developer to provide negative tone development (NTD) in which the unexposed region of the latent pattern is removed by the action of a negative tone developer. Useful solvents for negative tone development include those also useful for dissolving, dispensing, and coating. Exemplary negative tone developer solvents include methyl 2-hydroxybutyrate (HBM), propylene glycol monomethyl ether acetate (PGMEA), methoxyethoxypropionate, ethoxyethoxypropionate, and gamma-butyrolactone, cyclohexanone, 2-heptanone, and so forth.

Accordingly, in one example embodiment, techniques herein can include methods for patterning a substrate. Referring now to FIG. 1, a substrate 100 is received having a first relief pattern 131. The substrate 100 includes an underlying layer 110 (which can be considered as a target layer) positioned on a base layer 105. The base layer 105 and underlying layer 110 can both include multiple layers and films, but for convenience they are illustrated as having a single material. The first relief pattern 131 defines openings having a width less than sufficient to enable wave propagation of electromagnetic radiation having wavelengths greater than a predetermined threshold wavelength. For example, dimension 181 shows a width of openings that are small enough to prevent propagation of electromagnetic radiation greater than a threshold wavelength. The openings illustrated can be holes or trenches defined by the first relief pattern 131. Note that width refers to the short dimension of a trench, the short dimension of an ellipse, or the diameter of a hole. Trenches can have relatively long lengths, but with widths small enough the trenches can prevent quantum mechanical tunneling of certain light wavelengths.

Figure 2:
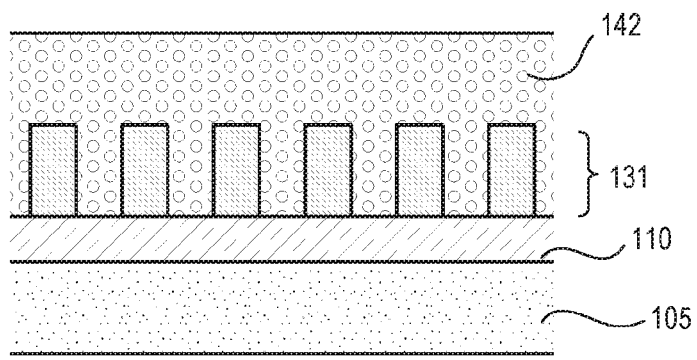
FIG. 2 is a cross-sectional schematic view of an example substrate segment showing a process flow according to embodiments disclosed herein.

Referring to FIG. 2, a first photoresist is deposited on the substrate such that the first photoresist fills openings defined by the first relief pattern 131 and covers the first relief pattern 131 resulting in a first photoresist layer 142 that fills openings defined by the first relief pattern 131 and covers the first relief pattern 131. The first photoresist layer 142 includes a solubility-shifting component that causes regions of the first photoresist layer 142 exposed to actinic radiation to become insoluble to a negative tone developer while regions unexposed to actinic radiation remain soluble to the negative tone developer. FIG. 2 shows the first photoresist layer 142 providing a planar surface and filling and covering the first relief pattern 131.

Figure 3:
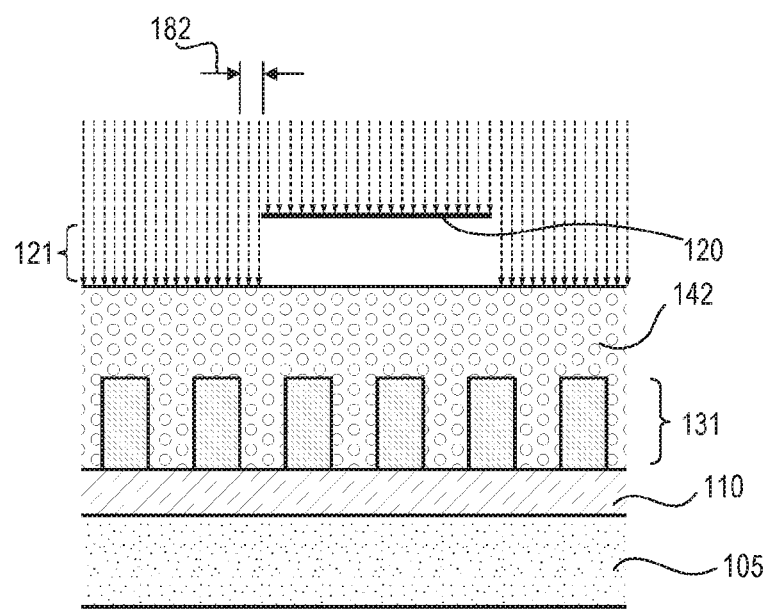
FIG. 3 is a cross-sectional schematic view of an example substrate segment showing a process flow according to embodiments disclosed herein.

FIG. 3 shows the substrate being exposed to actinic radiation 121 having wavelengths greater than the predetermined threshold wavelength. Such exposure can be executed using a photolithography scanner or stepper tool. Photomask 120 is used to mask certain portions of first photoresist layer 142 from actinic radiation 121. Note that in this example there is misalignment of the photomask 120. In this example, the photomask 120 was intended to cover all of a particular trench, but was too far to the right. Dimension 182 shows an area that the photomask 120 was intended or designed to cover. Such overlay misalignment can be a result of multiple factors including non-uniformity within the substrate itself. Thus, the trench under the left edge of photomask 120 was supposed to be fully covered (shadowed), but instead was only partially covered.

Figure 4:
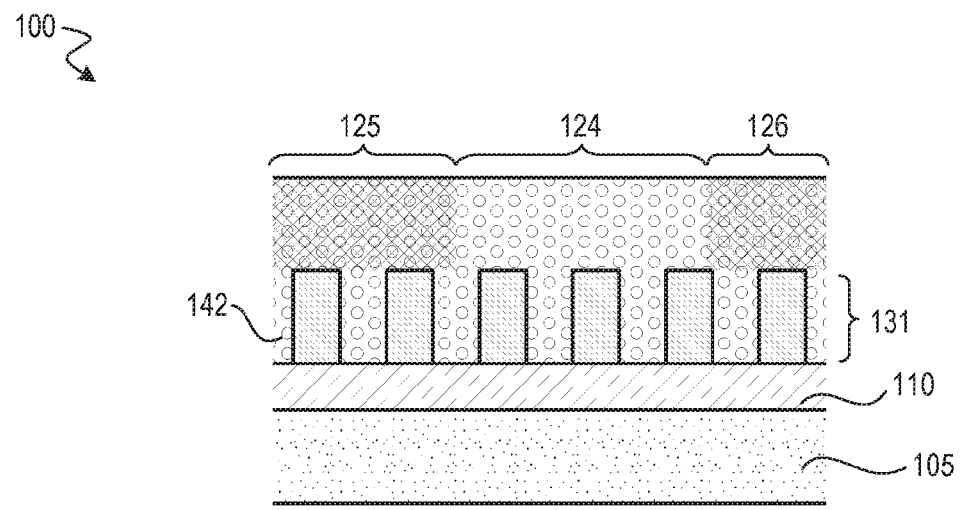
FIG. 4 is a cross-sectional schematic view of an example substrate segment showing a process flow according to embodiments disclosed herein.

FIG. 4 shows a result of this exposure. Regions 125 and 126 of first photoresist layer 142 that were exposed to actinic radiation 121 have now become insoluble to a negative tone developer, while region 124, which was shadowed, remains soluble to negative tone developers. Note that region 125 partially covers one trench.

Figure 5:
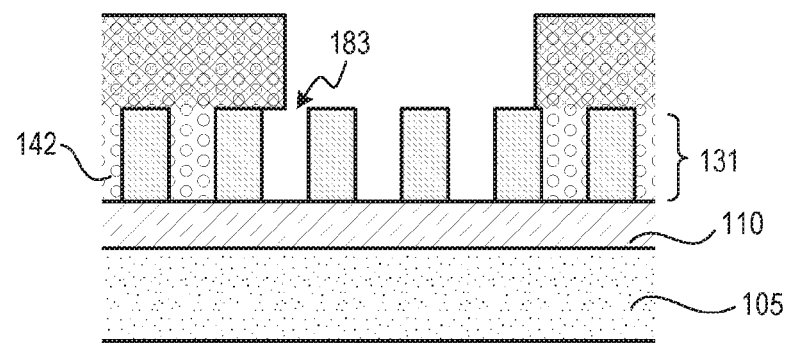
FIG. 5 is a cross-sectional schematic view of an example substrate segment showing a process flow according to embodiments disclosed herein.

Referring now to FIG. 5, the first photoresist layer 142 is developed using negative tone developer after the first photoresist layer 142 has been exposed to a pattern of actinic radiation having wavelengths greater than the predetermined threshold wavelength. This developing includes dissolving and removing first photoresist from filled openings in the first relief pattern that have been uncovered including openings that are partially covered by insoluble first photoresist. Note that the trench that had been partially uncovered (shown with arrow 183) has been cleared of first photoresist. Thus, even though there was misalignment during the photolithographic exposure process, the trench was still cleared out. Note also that actinic radiation that rendered part of overlying photoresist insoluble, was nevertheless unable to propagate within the trench and thus could not render insoluble the photoresist that filled the trench.

Figure 6:
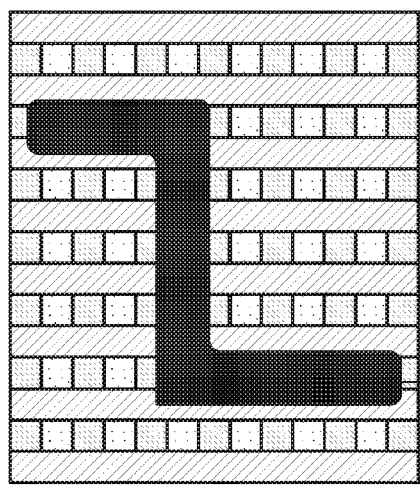
FIG. 6 is a cross-sectional schematic view of an example substrate segment showing a process flow according to embodiments disclosed herein.
Figure 7:
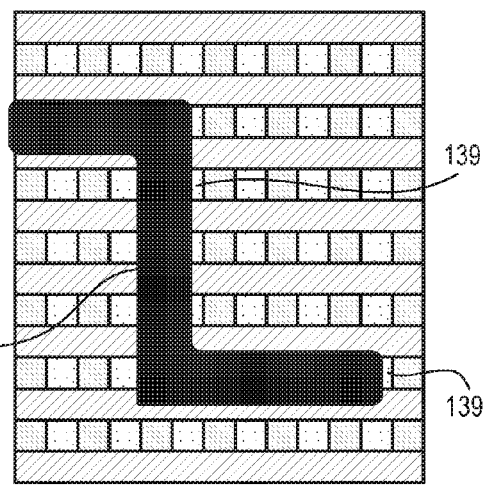
FIG. 7 is a cross-sectional schematic view of an example substrate segment showing a process flow according to embodiments disclosed herein.
Figure 8:
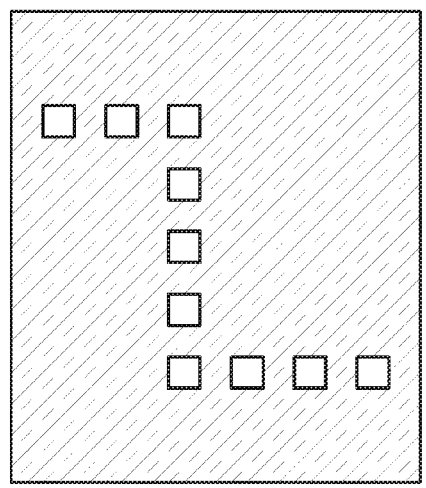
FIG. 8 is a cross-sectional schematic view of an example substrate segment showing a process flow according to embodiments disclosed herein.

In other embodiments, in response to the pattern of actinic radiation being partially misaligned such that a portion of first photoresist above a given opening defined by the first relief pattern becomes insoluble, then developing the first photoresist layer includes removing first photoresist within the given opening that is partially covered by insoluble first photoresist. Developing the first photoresist layer can include dissolving and removing first photoresist in trenches in which an overburden of first photoresist has been at least partially removed. FIGS. 6-8 illustrate this benefit. FIG. 6 is a top view of a substrate segment ready to receive a pattern of actinic radiation. Not shown is a layer of radiation-sensitive material to receive activating exposure. This layer is not shown for convenience in describing this process. What is shown is an array of openings. Photomask 192 indicates an area that should be shadowed or not receive actinic radiation. FIG. 6 shows a desired location for placement of photomask 192. FIG. 7 shows misalignment of photomask 192 such that openings 139 are only partially shadowed, with part of openings 139 exposed. This portion of photoresist will become insoluble. Nevertheless, the other half of these openings will remain soluble. Because the actinic radiation could not propagate down into the openings 139, the photoresist therein remains soluble to negative tone developer and can be removed. FIG. 8 then show a resulting patterned layer after pattern transfer and removing overlying relief patterns.

In some embodiments, the predetermined threshold wavelength is equal to or less than 192 nanometers such that light of 193 nanometer wavelengths and greater cannot propagate within openings defined by the first relief pattern. In other embodiments, openings defined by the first relief pattern are sized to permit propagation of 193 nanometer wavelength light, but prevent propagation of light having wavelengths of 248 nanometers or greater. In other embodiments, openings defined by the first relief pattern are sized to permit propagation of 248 nanometer wavelength light, but prevent propagation of light having wavelengths of 365 nanometers or greater.

The first relief pattern can be comprised of a second photoresist that has been photo lithographically patterned, developed and rendered insoluble to developers. Rendering the second photoresist insoluble to developers can include treating the substrate with a flux of ballistic electrons and sputtered silicon. The first relief pattern can include trenches formed using an anti-spacer fabrication step. Anti-spacer fabrication involves using acid diffusion from or to a different material at an interface of two materials. The diffusion interface can be dissolved and removed thereby forming an opening similar in dimensions to a sidewall spacer, but is an opening instead of sidewall spacer material.

Receiving the substrate can include the first relief pattern having trenches formed from a pitch density multiplication operation, such as self-aligned pitch quadrupling. Defined openings in the first relief pattern can be less than 50 nanometers. The first relief pattern can be comprised of a second photoresist that has been photo lithographically patterned, developed and rendered insoluble to developers. The first relief pattern can also be comprised of a third photoresist that has been photo lithographically patterned, developed and rendered insoluble to developers. The first photoresist layer, the second photoresist and the third photoresist can all be in plane with each other by using freezing techniques, such as an electron flux. The first photoresist can be a positive tone photoresist. Such techniques for creating three photoresist relief patterns in plane with either other and using a single anti-reflective coating are described in more detail in U.S. patent application Ser. No. 15/048,033 filed on Feb. 12, 2016 and titled "Method for Patterning Using a Composite Pattern." The contents of which are incorporated by reference in their entirety.

Another embodiment includes a method for patterning a substrate. A substrate is received having a first relief pattern. The first relief pattern defines trenches having a width less than 50 nanometers. A first photoresist is deposited on the substrate such that first photoresist fills trenches defined by the first relief pattern and covers the first relief pattern resulting in a first photoresist layer that fills the trenches defined by the first relief pattern and provides a covering of first photoresist above the first relief pattern. The first photoresist layer includes a solubility-shifting component that causes regions of the first photoresist layer exposed to actinic radiation to become insoluble to a negative tone developer. Regions unexposed to actinic radiation remain soluble to the negative tone developer. The first photoresist layer is developed using negative tone developer after the first photoresist layer has been exposed to a pattern of actinic radiation having wavelengths greater than 192 nanometers. Developing includes dissolving and removing first photoresist from filled trenches in the first relief pattern that have been uncovered. Developing the first photoresist layer can also include removing first photoresist from portions of the trenches that are partially covered by insoluble first photoresist.

Thus, techniques herein can be used to pattern substrates so that desired features are successfully formed within masks and substrate materials despite overlay or exposure misalignment. Accordingly, such techniques help enable continued shrinking of semiconductor critical dimensions and functional devices.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
receiving a substrate having a first relief pattern, the first relief pattern defining openings having a width less than sufficient to enable wave propagation of electromagnetic radiation having wavelengths greater than a predetermined threshold wavelength;
depositing a first photoresist on the substrate such that the first photoresist fills openings defined by the first relief pattern and covers the first relief pattern resulting in a first photoresist layer that fills openings defined by the first relief pattern and covers the first relief pattern, the first photoresist layer including a solubility-shifting component that causes regions of the first photoresist layer exposed to actinic radiation to become insoluble to a negative tone developer, wherein regions unexposed to the actinic radiation remain soluble to the negative tone developer; and developing the first photoresist layer using the negative tone developer after the first photoresist layer has been exposed to a pattern of actinic radiation having wavelengths greater than the predetermined threshold wavelength, developing including dissolving and removing the first photoresist from filled openings in the first relief pattern that have been uncovered.

2. The method of claim 1, wherein in response to the pattern of actinic radiation being partially misaligned such that a portion of first photoresist above a given opening defined by the first relief pattern becomes insoluble, developing the first photoresist layer includes removing the first photoresist within the given opening that is partially covered by insoluble regions of the first photoresist.

3. The method of claim 1, wherein developing the first photoresist layer includes dissolving and removing the first photoresist from trenches in which an overburden of the first photoresist has been at least partially removed.

4. The method of claim 1, wherein the predetermined threshold wavelength is equal to or less than 192 nanometers such that light of 193 nanometer wavelengths and greater cannot propagate within openings defined by the first relief pattern.

5. The method of claim 1, wherein openings defined by the first relief pattern are sized to permit propagation of 193 nanometer wavelength light, but prevent propagation of light having wavelengths of 248 nanometers or greater.

6. The method of claim 1, wherein openings defined by the first relief pattern are sized to permit propagation of 248 nanometer wavelength light, but prevent propagation of light having wavelengths of 365 nanometers or greater.

7. The method of claim 1, wherein the first relief pattern is comprised of a second photoresist that has been photo lithographically patterned, developed and rendered insoluble to developers.

8. The method of claim 7, wherein rendering the second photoresist insoluble to developers includes treating the substrate with a flux of ballistic electrons and sputtered silicon.

9. The method of claim 7, wherein the first relief pattern includes trenches formed using an anti-spacer fabrication step.

10. The method of claim 1, wherein the first relief pattern is comprised of a second photoresist that has been photo lithographically patterned, developed and rendered insoluble to developers, and wherein the first relief pattern is also comprised a third photoresist that has been photo lithographically patterned, developed and rendered insoluble to developers, wherein the first photoresist layer, the second photoresist and the third photoresist are in plane with each other.

11. The method of claim 1, wherein the first photoresist is a positive tone photoresist.

12. The method of claim 1, wherein defined openings in the first relief pattern are less than 50 nanometers.

13. The method of claim 1, wherein receiving the substrate includes the first relief pattern having trenches formed from a pitch density multiplication operation.

14. A method for patterning a substrate, the method comprising:

receiving a substrate having a first relief pattern, the first relief pattern defining openings having a width less than sufficient to enable wave propagation of electromagnetic radiation having wavelengths greater than a predetermined threshold wavelength;

depositing a first photoresist on the substrate such that the first photoresist fills openings defined by the first relief pattern and covers the first relief pattern resulting in a first photoresist layer that fills openings defined by the first relief pattern and covers the first relief pattern, the first photoresist layer including a solubility-shifting component that causes regions of the first photoresist layer exposed to actinic radiation to become insoluble to a negative tone developer, wherein regions unexposed to the actinic radiation remain soluble to the negative tone developer; and developing the first photoresist layer using the negative tone developer after the first photoresist layer has been exposed to a pattern of actinic radiation having wavelengths greater than the predetermined threshold wavelength, developing including dissolving and removing the first photoresist from filled openings in the first relief pattern that have been uncovered, wherein developing the first photoresist layer includes removing the first photoresist within given openings that are partially covered by insoluble regions of the first photoresist.

15. A method for patterning a substrate, the method comprising:

receiving a substrate having a first relief pattern, the first relief pattern defining trenches having a width less than 50 nanometers;

depositing first photoresist on the substrate such that the first photoresist fills trenches defined by the first relief pattern and covers the first relief pattern resulting in a first photoresist layer that fills the trenches defined by the first relief pattern and provides a covering of the first photoresist above the first relief pattern, the first photoresist layer including a solubility-shifting component that causes regions of the first photoresist layer exposed to actinic radiation to become insoluble to a negative tone developer, wherein regions unexposed to the actinic radiation remain soluble to the negative tone developer; and developing the first photoresist layer using the negative tone developer after the first photoresist layer has been exposed to a pattern of actinic radiation having wavelengths greater than 192 nanometers, wherein developing includes dissolving and removing the first photoresist from filled trenches in the first relief pattern that have been uncovered.

16. The method of claim 15, wherein developing the first photoresist layer includes removing the first photoresist from portions of the trenches that are partially covered by insoluble portions of the first photoresist.

* * * * *